(12) United States Patent
Tilton et al.

(10) Patent No.: US 7,992,626 B1
(45) Date of Patent: Aug. 9, 2011

(54) COMBINATION SPRAY AND COLD PLATE THERMAL MANAGEMENT SYSTEM

(75) Inventors: Charles L. Tilton, Liberty Lake, WA (US); Donald E. Tilton, Liberty Lake, WA (US); Thomas D. Weir, Pullman, WA (US); John D. Schwarzkopf, Pullman, WA (US)

(73) Assignee: Parker-Hannifin Corporation, Cleveland, OH (US)

( * ) Notice: Subject to any disclaimer, the term of this patent is extended or adjusted under 35 U.S.C. 154(b) by 1363 days.

(21) Appl. No.: 11/532,421

(22) Filed: Sep. 15, 2006

Related U.S. Application Data

(63) Continuation-in-part of application No. 11/046,657, filed on Jan. 28, 2005, now Pat. No. 7,331,377.

(60) Provisional application No. 60/540,921, filed on Jan. 30, 2004.

(51) Int. Cl.
*H05K 7/20* (2006.01)

(52) U.S. Cl. ............. 165/80.4; 165/104.26; 165/907; 361/699; 361/700; 361/25; 361/26

(58) Field of Classification Search .......... 165/80.4, 165/104.26, 104.33, 907; 361/699, 700
See application file for complete search history.

(56) References Cited

U.S. PATENT DOCUMENTS

| | | | | |
|---|---|---|---|---|
| 4,352,392 A | * | 10/1982 | Eastman | 165/908 |
| 4,897,762 A | * | 1/1990 | Daikoku et al. | 361/689 |
| 5,021,924 A | * | 6/1991 | Kieda et al. | 361/699 |
| 5,522,452 A | * | 6/1996 | Mizuno et al. | 165/908 |
| 5,720,338 A | * | 2/1998 | Larson et al. | 361/700 |
| 6,055,154 A | * | 4/2000 | Azar | 361/688 |
| 6,196,307 B1 | * | 3/2001 | Ozmat | 165/185 |
| 7,549,460 B2 | * | 6/2009 | East et al. | 165/80.4 |
| 2003/0118827 A1 | * | 6/2003 | Pinneo | 428/408 |

FOREIGN PATENT DOCUMENTS

| | | | | |
|---|---|---|---|---|
| GB | 2404009 A | * | 1/2005 | |
| JP | 60136349 A | * | 7/1985 | |

OTHER PUBLICATIONS

J.H. Kim et al, "Effective spray cooling of plain and microporous coated surfaces", International Journal of Heat and Mass Transfer 47 (2004) 3307-3315, USA.
Dr. S. M. You, "Advanced Technology Boiling Enhancement", University of Texas at Arlington Micro-Scale Heat Transfer Laboratory, http://www-heat.uta.edu/coating/coating.html.
Applied Porous Technologies, Inc., "APT's New Seamless Porous Metal Tubes Have Many Applications", http://www.appliedporous.com/newsrls/tubes.htm.

* cited by examiner

*Primary Examiner* — Leonard R Leo
(74) *Attorney, Agent, or Firm* — Michael Neustal

(57) ABSTRACT

A combination spray and cold plate thermal management system for effectively thermally managing a heat producing device during startup. The combination spray and cold plate thermal management system includes a spray unit thermally managing a heat producing device and a coolant reservoir thermally connected to the heat producing device. The coolant reservoir includes a porous media with coolant channels for storing a volume of the waste coolant after spraying of coolant has terminated. The coolant reservoir is fluidly connected to the spray chamber within the spray unit to receive the waste coolant.

11 Claims, 3 Drawing Sheets

COMBINATION SPRAY AND COLD PLATE THERMAL MANAGEMENT SYSTEM

CROSS REFERENCE TO RELATED APPLICATIONS

I hereby claim benefit under Title 35, United States Code, Section 119(e) of U.S. provisional patent application Ser. No. 60/540,921 filed Jan. 30, 2004. I hereby claim benefit under Title 35, United States Code, Section 120 of U.S. patent application Ser. No. 11/046,657 filed Jan. 28, 2005. This application is a continuation-in-part of the application Ser. No. 11/046,657 Jan. 28, 2005 now U.S. Pat. No. 7,331,377 and the 60/540,921. The application Ser. No. 11/046,657 is currently pending and the 60/540,921 is abandoned. The application Ser. No. 11/046,657 and application 60/540,921 are hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to thermally management system and more specifically it relates to a combination spray and cold plate thermal management system for effectively thermally managing a heat producing device during startup.

2. Description of the Related Art

Any discussion of the prior art throughout the specification should in no way be considered as an admission that such prior art is widely known or forms part of common general knowledge in the field.

Modern electronic devices (e.g. microprocessors, circuit boards and power supplies) and other heat producing devices have significant thermal management requirements. Conventional dry thermal management technology (e.g. forced air convection using fans and heat sinks) simply is not capable of efficiently thermally managing modern electronics.

Single-phase liquid thermal management systems (e.g. liquid cold plates) and two-phase liquid thermal management systems (e.g. spray cooling, pool boiling, flow boiling, jet impingement cooling, falling-film cooling, parallel forced convection, curved channel cooling and capillary pumped loops) have been in use for years for thermally managing various types of heat producing devices. Spray cooling technology is being adopted today as the most efficient option for thermally managing electronic systems. U.S. Pat. No. 5,220,804 entitled High Heat Flux Evaporative Spray Cooling to Tilton et al. describes the earlier versions of spray technology as applied to electronics. U.S. Pat. No. 6,108,201 entitled Fluid Control Apparatus and Method for Spray Cooling to Tilton et al. also describes the usage of spray technology to cool a printed circuit board.

BRIEF SUMMARY OF THE INVENTION

In view of the foregoing disadvantages inherent in the known types of thermal management systems now present in the prior art, the present invention provides a new combination spray and cold plate thermal management system construction wherein the same can be utilized for effectively thermally managing a heat producing device during startup, or during transient power spikes encountered in the course of normal operation.

The general purpose of the present invention, which will be described subsequently in greater detail, is to provide a new combination spray and cold plate thermal management system that has many of the advantages of the thermal management systems mentioned heretofore and many novel features that result in a new combination spray and cold plate thermal management system which is not anticipated, rendered obvious, suggested, or even implied by any of the prior art thermal management systems, either alone or in any combination thereof.

To attain this, the present invention generally comprises a spray unit thermally managing a heat producing device and a coolant reservoir thermally connected to the heat producing device. The coolant reservoir includes a porous media with coolant channels for storing a volume of the waste coolant during operation and after spraying of coolant has terminated. The coolant reservoir is fluidly connected to the spray chamber within the spray unit to receive the waste coolant.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction nor to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a combination spray and cold plate thermal management system that will overcome the shortcomings of the prior art devices.

A second object is to provide a combination spray and cold plate thermal management system for effectively thermally managing a heat producing device during startup.

A further object is to provide a combination spray and cold plate thermal management system that assists in thermal management of a heat producing device during startup after a long period of "off" time where coolant has had time to drain from the spray unit supply line(s).

Another object is to provide a combination spray and cold plate thermal management system that utilizes waste coolant to assist in the thermal management of a heat producing device.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
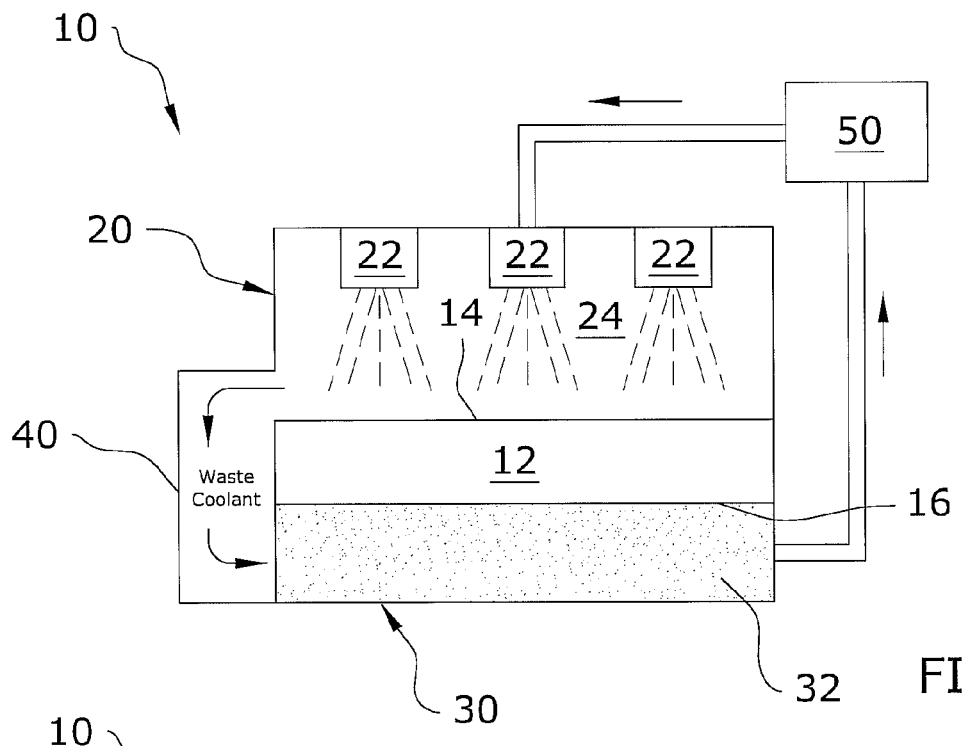
FIG. 1 is a side illustration of the present invention.

Turning now descriptively to the drawings, in which similar reference characters denote similar elements throughout the several views, FIGS. 1 through 6 illustrate a combination spray and cold plate thermal management system 10, which comprises a spray unit 20 thermally managing a heat producing device 12 and a coolant reservoir 30 thermally connected to the heat producing device 12. The coolant reservoir 30 includes a porous media 32 with coolant channels 34 for storing a volume of the waste coolant after spraying of coolant has terminated. The coolant reservoir 30 is fluidly connected to the spray chamber 24 within the spray unit 20 to receive the waste coolant.

B. Spray Unit

The spray unit 20 preferably has a separate enclosed structure for retaining and thermally managing the heat producing devices 12. The spray unit 20 may have an integral card cage spray assembly or similar structure for retaining the heat producing device 12 such as illustrated in U.S. Pat. No. 5,880,931. More than one spray unit 20 may be utilized within the present invention.

The spray unit 20 may include one or more spray nozzles 22 for applying atomized coolant upon the heat producing devices 12. The spray unit 20 may be comprised of various well-known spray cooling systems currently available for thermally managing heat producing devices 12 with an atomized coolant The atomized coolant may be comprised of various types of coolants including but not limited to Fluorinet (a trademark of the 3M corporation) water, alcohol, Dow Corning's OS-10, an azeotrope such as Dow Corning's OS-120, and the like. An exemplary spray cooling system is illustrated in U.S. Pat. No. 6,104,610 and is hereby incorporated by reference into this application.

Figure 2:
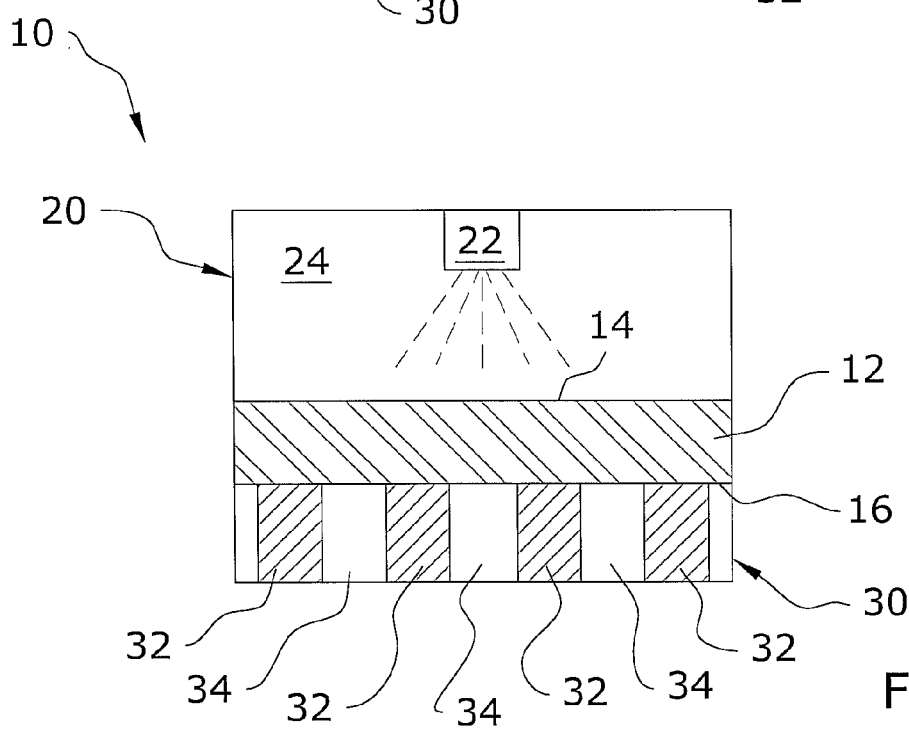
FIG. 2 is an end illustration of the present invention showing the coolant channels within the porous media.

The spray unit 20 includes a spray chamber 24 and at least one spray nozzle 22 as illustrated in FIGS. 1 and 2 of the drawings. The spray unit 20 is fluidly connected to the thermal management unit 50 to receive thermally conditioned coolant. The liquid coolant is dispensed via the spray nozzles 22 within the spray unit 20 producing coolant vapor and waste liquid coolant which is returned to the thermal management unit 50 for thermal conditioning as illustrated in FIG. 1 of the drawings. The liquid coolant may be thermally conditioned via various types of liquid coolant thermal management technologies.

One or more heat producing devices 12 (e.g. electronic devices) are positioned within the spray chamber 24 of the spray unit 20 as shown in FIGS. 1 and 2 of the drawings. The heat producing device 12 may be comprised of but not limited to a thermal via or heat sink that is in thermal communication with an electronic device. The spray unit 20 sprays coolant upon a first surface 14 of the heat producing device 12 to thermally manage the heat producing device 12. The coolant is at least partially vaporized resulting in the thermal management of the heat producing device 12 and the two phase mixture circulates into the reservoir and through the porous media.

As shown in FIG. 1 of the drawings, a thermal management unit 50 is fluidly connected to the spray unit 20 to provide a pressurized supply of thermally conditioned coolant to the spray unit 20. The thermal management unit 50 may be comprised of any conventional thermal management system capable of receiving and thermally treating heated waste coolant from the spray unit 20. The thermal management unit 50 preferably also includes pumps, filters and heat exchangers as are well known in the industry.

C. Coolant Reservoir

The coolant reservoir 30 is thermally connected to a second side of the heat producing device 12. The coolant reservoir 30 has an interior cavity capable of storing a volume of liquid coolant during periods of when the spray unit 20 is non-operational.

The coolant reservoir 30 may be in direct physical contact with the second side of the heat producing device 12 as shown in FIGS. 1 and 2 of the drawings. The coolant reservoir 30 may be in indirect contact with the second side of the heat producing device 12 with a board positioned between the same. Preferably, with this arrangement, thermal vias or another thermal transfer mechanism is incorporated into the board structure and is in thermal communication with the porous media. The first surface 14 and the second side of the heat producing device 12 are preferably opposing sides of the heat producing device 12 as shown in FIGS. 1 and 2 of the drawings.

The coolant reservoir 30 is fluidly connected to the spray unit 20 by a transfer channel 40. The transfer channel 40 is preferably comprised of a path defined by the housing of the spray unit 20 as shown in FIG. 1 of the drawings. However, the transfer channel 40 may be comprised of an independent conduit fluidly connecting the spray unit 20 to the coolant reservoir 30.

The coolant reservoir 30 receives the waste coolant produced from thermally managing the heat producing device 12 within the spray unit 20 as shown in FIG. 1 of the drawings. The coolant reservoir 30 is fluidly connected to the thermal management unit 50 to transfer the waste coolant to the thermal management unit 50 for thermal conditioning.

D. Porous Media

A volume of porous media 32 is preferably positioned within the coolant reservoir 30 as illustrated in FIGS. 1 and 2 of the drawings. The porous media 32 is preferably opposite of the spray unit 20 as further shown in FIGS. 1 and 2 of the drawings. The porous media 32 is preferably thermally connected to the second surface 16 of the heat producing device 12 as illustrated in FIGS. 1 and 2 of the drawings. The porous media 32 is comprised of a material capable of retaining a volume of waste coolant received from the spray unit 20 such as but not limited to diamond foam, aluminum foam, carbon foam, or copper clad aluminum foam. The porous media 32 is preferably comprised of a non-electrically conductive material. In another embodiment, the preferred construction is to implement the porous media 32 as part of an electrical circuit, and therefore an electrically conductive porous media would be utilized. The porous media 32 is preferably constructed so that the working fluid is passively pumped, or wicked, into contact with the heat producing device 12 using surface tension forces.

In another embodiment, the porous media 32 is preferably constructed to have varying pore size to allow coolants of various surface tensions to be wicked up to the heat producing device 12. In this embodiment, two or more immiscible coolants are circulated by the thermal management system, where at least one coolant is suited well to spraying, atomization, and or to direct contact with electronics while at least one other coolant is used for thermal conduction in the porous media 32. In this embodiment, at least one coolant would be sprayed and or wicked up into direct contact with the heat producing device 12 while the other coolant would carry heat away without ever making direct contact with the heat producing device 12 through thermal contact with the porous media.

As further shown in FIG. 2 of the drawings, one or more coolant channels 34 preferably extend through the porous media 32 to allow for the waste coolant to freely flow through the coolant reservoir 30 to the thermal management unit 50. As shown in FIG. 2 of the drawings, the coolant channels 34 may extend completely through the porous media 32 to expose the surface of the heat producing device 12. As the waste coolant flows through the coolant channels 34, a portion of the waste coolant is collected within the porous material and retained within the same during operation.

The coolant channels 34 are preferably sized to achieve annular flow of a two-phase coolant in both a vaporized state and a fluid state. Two-phase annular flow is where coolant in the vapor phase flows down a center portion of the coolant channels 34 and the liquid phase coolant is forced to flow along the inner walls of the coolant channels 34. The two-phase annular flow causes a liquid film flowing along the inner walls of the coolant channels 34 to be very thin. The liquid film along the inner walls of the coolant channels 34 and a portion of the liquid film is evaporated increasing the heat transfer rates.

The one or more coolant channels 34 are depicted as being substantially parallel to one another as best illustrated in FIG. 2 of the drawings. However, various other configurations may be utilized for the coolant channels 34 such as but not limited to staggered, wavy, offset or broken up channels. While non-straight configuration for the coolant channels 34 results in increased resistance for the coolant flow, a non-straight configuration results in increased thermal conduction between the coolant and the porous media.

E. First Alternative Embodiment

Figure 3:
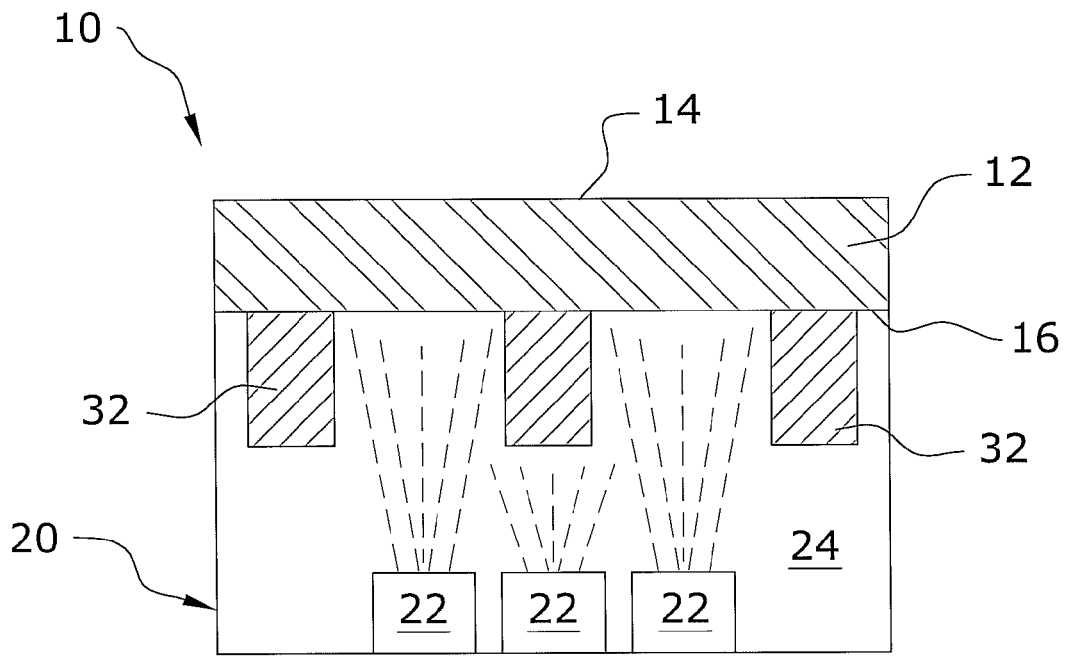
FIG. 3 is an end illustration of a first alternative embodiment of the present invention with the spray units positioned below the heat producing device and spraying upwardly upon the heat producing device and the porous media.
Figure 4:
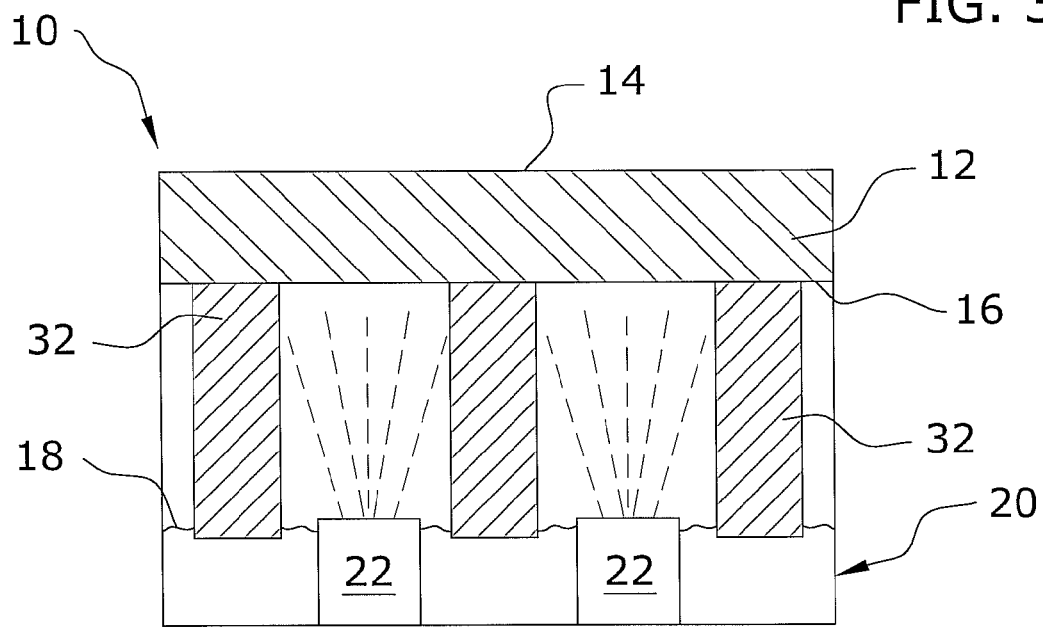
FIG. 4 is an end illustration of the first alternative embodiment showing wherein the spray nozzles are above a coolant level and wherein the porous media is in contact with the coolant.

FIGS. 3 and 4 illustrate a first alternative embodiment wherein the spray chamber 24 of the spray unit 20 also comprises the coolant reservoir for receiving the waste coolant. The spray unit 20 is attached to the heat producing device 12 so that the spray nozzles 22 spray the coolant substantially upwardly upon the second surface 16 as further shown in FIG. 3 of the drawings. The waste coolant is retained within the porous media 32 and within the spray chamber 24 during operation of the present invention.

In the first alternative embodiment, the second surface 16 is comprised of the bottom surface and the first surface 14 is comprised of an upper surface. It is preferable that the porous media 32 is connected to the second surface. The spray nozzles 22 are preferably staggered so that some spray nozzles 22 spray the coolant upon the porous media 32 and some of the spray nozzles 22 spray the coolant upon the second surface 16. The spray nozzles 22 preferably spray the coolant upon the second surface 16 through the coolant channels 34.

As shown in FIG. 4 of the drawings, it is preferable that the coolant level 18 within the spray chamber 24 is below the upper spray ends of the spray nozzles 22 to prevent obstruction of the coolant spray. In addition, it is preferable that at least a portion of the porous media 32 is in contact with the coolant and below the coolant level 18 to draw the coolant by capillary action as shown in FIG. 4 of the drawings.

F. Second Alternative Embodiment

Figure 5:
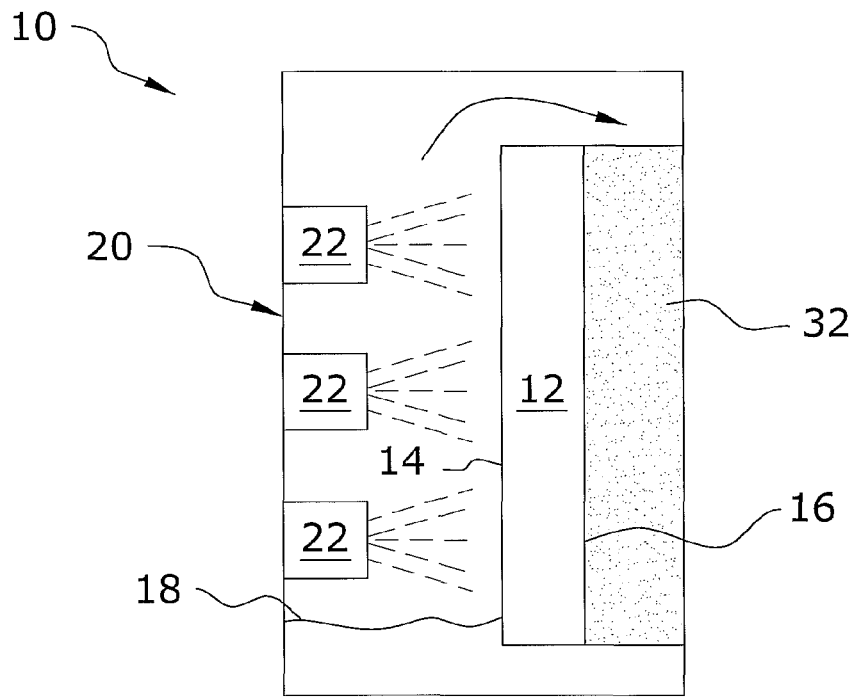
FIG. 5 is a side illustration of a second alternative embodiment showing a straight application of coolant spray upon the heat producing device.
Figure 6:
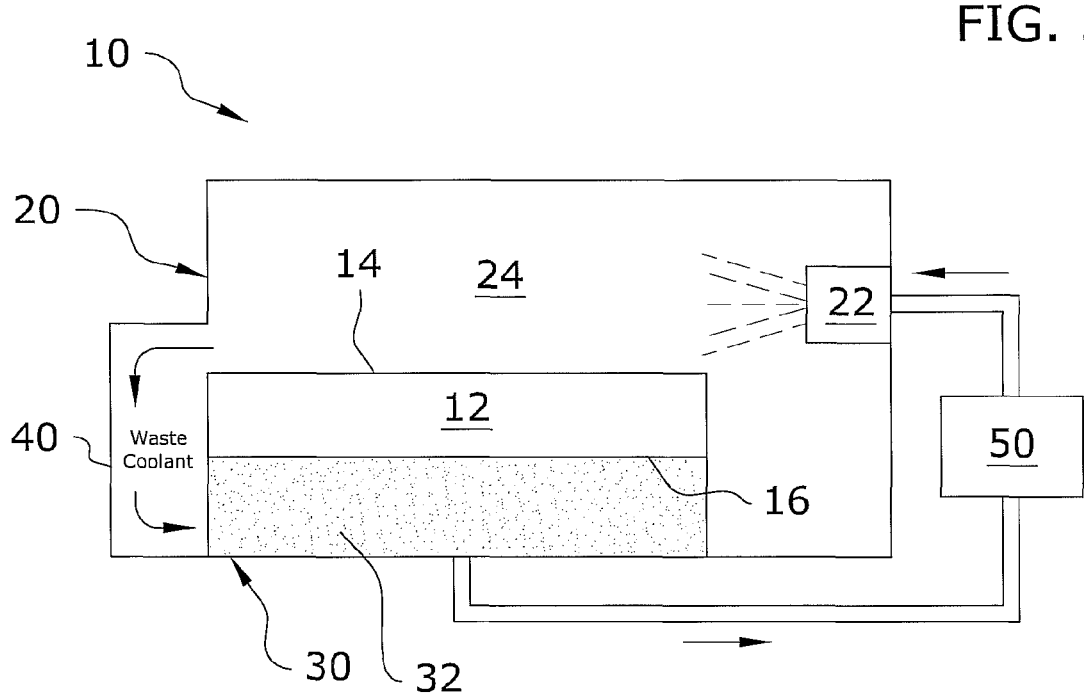
FIG. 6 is a side illustration showing a transverse spray application of coolant spray upon the heat producing device.

FIG. 5 illustrates a second alternative embodiment where the heat producing device 12 is rotated ninety-degrees within the spray unit 20 which is a preferable arrangement in mobile applications where the spray unit 20 is being tilted into various positions. The porous media 32 is preferably thermally connected to the second surface 16 and to the inner wall of the spray unit 20. FIG. 5 illustrates application of coolant spray upon the heat producing device 12 from the perpendicular. FIG. 6 illustrates a transverse spray application of coolant spray upon the heat producing device 12. Other angles of spray impact (not shown) could be utilized within the scope of this invention.

G. Operation of Invention

In operation, the spray unit 20 applies coolant upon one or more heat producing devices 12 (e.g. microprocessor, circuit board, power converter, and or power supply). The coolant is partially vaporized with the waste coolant and vapor passing through the transfer channel 40 as shown in FIG. 1 of the drawings. The waste coolant then flows through the coolant channels 34 and the porous media 32. The waste coolant continues to flow to the thermal management unit 50 with a portion of the waste coolant remaining within the porous media 32. When the spray unit 20 is deactivated (intentionally or unintentionally), a portion of the waste coolant remains in the coolant reservoir 30, such as within the porous media 32 and within the coolant channels 34. Hence, when the heat producing device 12 is activated during startup, a volume of the coolant within the coolant reservoir 30 temporarily thermally manages the heat producing device 12 until the spray unit 20 is able to be activated with the thermally conditioned coolant. The coolant remaining within the coolant reservoir 30 is also beneficial for increasing the thermal management of the heat producing device 12 during normal operation and for providing a temporary thermal management backup for times when fluid flow to the spray unit 20 is interrupted while the heat producing device 12 is still active or still requires cooling.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. A thermal management system for thermally managing one or more heat producing devices, comprising:
   a heat producing device having a bottom surface and an upper surface;
   a spray unit attached to said heat producing device, wherein said spray unit includes a spray chamber and at least one spray nozzle; and
   a porous media connected to a bottom surface of said heat producing device;
   wherein said spray unit sprays atomized coolant upwardly upon said bottom surface of said heat producing device and said porous media to thermally manage said heat producing device;
   wherein said spray chamber within said spray unit receives a waste coolant produced from thermally managing said heat producing device;
   wherein said porous media retains waste coolant within said porous media when said spray unit sprays coolant;
   wherein at least a portion of said porous media extends downwardly and into a level of coolant within said spray chamber.

2. The thermal management system of claim 1, wherein said porous media is comprised of diamond foam.

3. The thermal management system of claim 2, wherein said porous media includes one or more coolant channels.

4. The thermal management system of claim 3, wherein said one or more coolant channels expose said bottom surface of said heat producing device.

5. The thermal management system of claim 1, wherein said spray unit is fluidly connected to a thermal management unit.

6. The thermal management system of claim 1, wherein said porous media is comprised of carbon foam.

7. The thermal management system of claim 1, wherein said heat producing device is comprised of an electronics device.

8. The thermal management system of claim 1, wherein a spray end of said at least one spray nozzle is positioned above said level of coolant in said spray chamber.

9. The thermal management system of claim 1, wherein said porous media is comprised of aluminum foam or copper clad aluminum foam.

10. The thermal management system of claim 1, wherein said porous media passively wicks said coolant into contact with said heat producing device using surface tension forces.

11. A thermal management system for thermally managing one or more heat producing devices, comprising:
   a heat producing device having a bottom surface and an upper surface;
   a spray unit attached to said heat producing device, wherein said spray unit includes a spray chamber and at least one spray nozzle; and
   a porous media connected to a bottom surface of said heat producing device;
   wherein said spray unit sprays atomized coolant upwardly upon said bottom surface of said heat producing device and said porous media to thermally manage said heat producing device;
   wherein said spray chamber within said spray unit receives a waste coolant produced from thermally managing said heat producing device;
   wherein said porous media retains waste coolant within said porous media when said spray unit spray coolant;
   wherein said porous media is comprised of diamond foam;
   wherein said porous media includes one or more coolant channels;
   wherein said one or more coolant channels expose said bottom surface of said heat producing device;
   wherein said spray unit is fluidly connected to a thermal management unit;
   wherein said heat producing device is comprised of an electronics device;
   wherein at least a portion of said porous media extends downwardly and into a level of coolant within said spray chamber;
   wherein a spray end of said at least one spray nozzle is positioned above said level of coolant in said spray chamber;
   wherein said porous media passively wicks said coolant into contact with said heat producing device using surface tension forces.

* * * * *